(12) United States Patent
Lictao, Jr. et al.

(10) Patent No.: US 11,482,478 B2
(45) Date of Patent: Oct. 25, 2022

(54) SHIELDED ELECTRONIC PACKAGE AND METHOD OF FABRICATION

(71) Applicant: NXP B.V., Eindhoven (NL)

(72) Inventors: Crispulo Estira Lictao, Jr., Binan (PH); Chayathorn Saklang, Bangplee (TH); Amornthep Saiyajitara, Bangken (TH); Chanon Suwankasab, Pathumthani (TH); Stephen Ryan Hooper, Mesa, AZ (US); Bernd Offermann, Hamburg (DE)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 16/936,480

(22) Filed: Jul. 23, 2020

(65) Prior Publication Data

US 2022/0028766 A1  Jan. 27, 2022

(51) Int. Cl.
*H01L 23/552* (2006.01)
*H01L 23/495* (2006.01)
*H01L 23/00* (2006.01)
*H01L 25/00* (2006.01)

(52) U.S. Cl.
CPC ...... *H01L 23/49575* (2013.01); *H01L 23/552* (2013.01); *H01L 24/48* (2013.01); *H01L 24/73* (2013.01); *H01L 25/50* (2013.01); *H01L 2224/48091* (2013.01); *H01L 2224/48145* (2013.01); *H01L 2224/48247* (2013.01); *H01L 2224/73215* (2013.01)

(58) Field of Classification Search
CPC .. H01L 23/49575; H01L 23/552; H01L 24/48
See application file for complete search history.

(56) References Cited

U.S. PATENT DOCUMENTS

| 7,109,410 | B2 | 9/2006 | Arnold et al. |
| 8,686,547 | B1 | 4/2014 | Kao et al. |
| 2016/0172309 | A1* | 6/2016 | Gong .................... H01L 23/552 257/659 |
| 2017/0186644 | A1 | 6/2017 | Herard et al. |
| 2017/0263565 | A1 | 9/2017 | Renard et al. |
| 2020/0219800 | A1* | 7/2020 | Khor ................ H01L 23/49513 |
| 2022/0028798 | A1* | 1/2022 | Sirinorakul ......... H01L 23/4334 |

FOREIGN PATENT DOCUMENTS

WO  WO-2012/074775 A1  6/2012

* cited by examiner

*Primary Examiner* — Errol V Fernandes

(57) ABSTRACT

An electronic device package includes a first die coupled to a substrate, a second die coupled with the first die, and a spacer element coupled to the second die to form a stacked structure that includes the first die, the second die, and the spacer element. An electrically conductive shield overlies the stacked structure. The shield has a first end coupled to the spacer element and a second end coupled to the substrate. Inter-chip bond wires may electrically interconnect the first and second dies, and the shield may additionally overlie the bond wires. The spacer element may extend above a surface of the second die at a height that is sufficient to prevent the shield from touching the inter-chip bond wires.

16 Claims, 4 Drawing Sheets

SHIELDED ELECTRONIC PACKAGE AND METHOD OF FABRICATION

TECHNICAL FIELD OF THE INVENTION

The present invention relates generally to shielded semiconductor electronic device packages. More specifically, the present invention relates to an electromagnetic interference (EMI) shield integrally formed within an electronic device package.

BACKGROUND OF THE INVENTION

Semiconductor electronic device packages are utilized in a wide variety of electronics applications. Such electronic device packages may include integrated circuits, sensor components, and so forth that are typically protected from the external environment by encapsulation with an epoxy material, thermoset, thermoplastic resin, and the like. Such a package provides protection from dust, humidity, and other environmental factors, which may destroy or irreparably damage the circuitry of the component. Some semiconductor electronic device packages may include a stacked structure of two or more semiconductor dies. These dies may be electrically connected to one another via electrical interconnects, sometimes referred to as bond wires. Additional electrical interconnects may connect one or more of the dies to an underlying substrate, such as a lead frame. External sources may generate electromagnetic interference (EMI) that could adversely influence the electrical interconnects between the semiconductor dies, which may in turn lead to electrostatic discharge (ESD) failure in an end-use application.

SUMMARY

Aspects of the disclosure are defined in the accompanying claims.

In a first aspect, there is provided an electronic device package comprising a substrate; a first die coupled to the substrate; a second die coupled with the first die; a spacer element coupled to the second die to form a stacked structure that includes the first die, the second die, and the spacer element; and an electrically conductive shield overlying the stacked structure, the electrically conductive shield having a first end physically coupled to the spacer element and a second end physically coupled to the substrate.

In a second aspect, there is provided a method of fabricating an electronic device package comprising coupling a first die to the substrate; coupling a second die with the first die; coupling a spacer element to the second die to form a stacked structure that includes the first die, the second die, and the spacer element; physically coupling a first end of an electrically conductive shield to the spacer element; and physically coupling a second end of the electrically conductive shield to the substrate such that the electrically conductive shield overlies the stacked structure.

In a third aspect, there is provided an electronic device package comprising a substrate; a first die coupled to the substrate, the first die having a first active surface and a first bond pad formed on the first active surface; a second die coupled with the first die, the second die having a second active surface and a second bond pad formed on the second active surface; a spacer element coupled to the second active surface of the second die to form a stacked structure that includes the first die, the second die, and the spacer element, the spacer element being characterized by a first height above the second active surface; a bond wire electrically interconnecting the first and second bond pads, the second bond wire extending to a second height above the second active surface of the second die, the second height being less than the first height; an electrically conductive shield overlying the stacked structure and the bond wire, the electrically conductive shield having a first end physically coupled to the spacer element and a second end physically coupled to the substrate; and a molding compound encapsulating the substrate, the stacked structure, the bond wire, and the electrically conductive shield.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns an electronic device package having an electromagnetic interference (EMI) shield integrally formed within the electronic device package and a method of fabricating the electronic device package. More particularly, the electronic device package includes a stacked structure of dies with the bottommost die being coupled to a substrate. Electrical interconnects, e.g., bond wires, may be connected between the dies of the stacked structure. A spacer element is attached to the topmost die of the stacked structure and an electrically conductive shield overlies the stacked structure of dies. One end of the shield is attached to the spacer element and the opposing end of the shield is attached to the substrate. The shield can provide EMI shielding for at least the electrical interconnects between the dies of the stacked structure. Additionally, the spacer element has a defined thickness that allows sufficient clearance between the bond wires and the shield to prevent electrical shorting of the bond wires and the EMI shield. Still further, the electronic device package may be over molded and the spacer element may serve to more uniformly distribute the stress from the mold compound imposed upon the stacked structure.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions.

Figure 1:
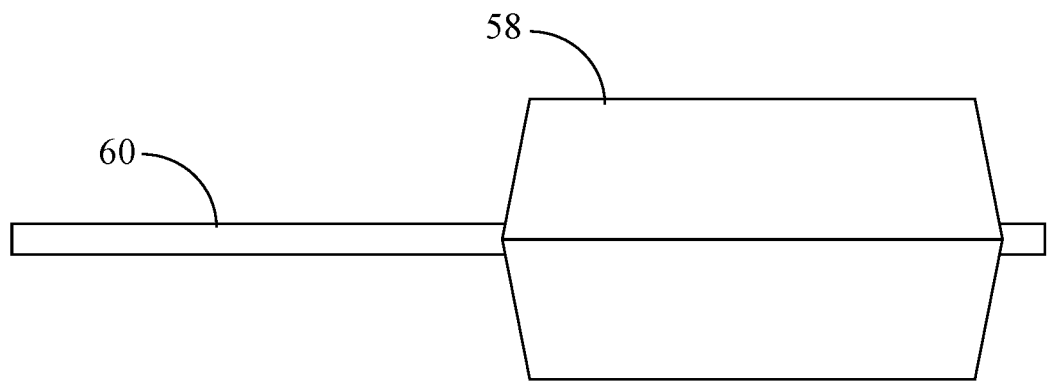
FIG. 1 shows a side view of an electronic device package.
Figure 2:
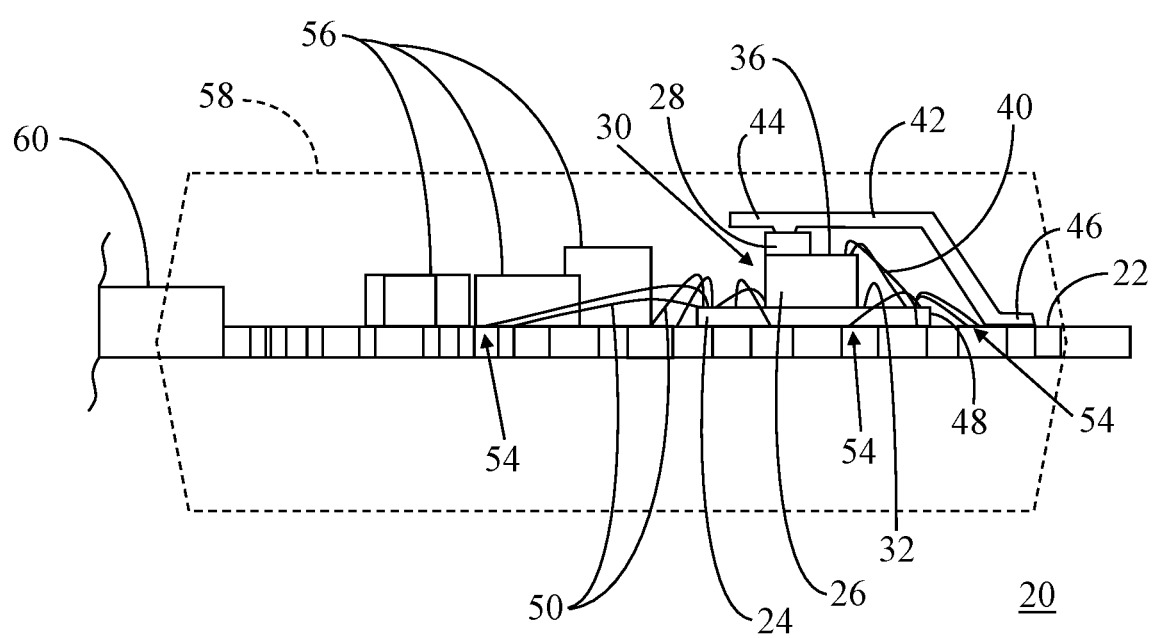
FIG. 2 shows a side view of interior components of the electronic device package of FIG. 1 in accordance with an embodiment.

Referring to FIGS. 1 and 2, FIG. 1 shows a side view of an electronic device package 20 and FIG. 2 shows a side view of interior components of the electronic device package 20 in accordance with an embodiment. In general, electronic device package 20 includes a substrate, referred to as a lead frame 22 in this example. A first die 24 is coupled to lead frame 22, a second die 26 is coupled with first die 24, and a spacer element 28 is coupled to second die 26. Collectively, first die 24, second die 26, and spacer element 28 form a stacked structure 30.

First and second dies 24, 26 may be any of a wide variety of integrated circuits (IC's), sensor dies, and so forth. In this example, first die 24 may be an application specific integrated circuit (ASIC) and second die 26 may be a sensor die. First die 24 may be configured to suitably process signals output from sensor die 26. As such, first die 24 has a first active surface 32 and one or more first bond pads 34 (see FIG. 3) formed on first active surface 32. Second die 26 has a second active surface 36 and one or more second bond pads 38 (see FIG. 3) formed on second active surface 36. Electronic device package 20 further includes one or more bond wires 40 suitably interconnecting first and second bond pads 34, 38. Bond wires 40 interconnecting first and second dies 24, 26 will be referred to herein as inter-chip bond wires 40. Although stacked structure 30 only includes two dies (e.g., first and second dies 24, 26) and spacer element 28, it should be understood that a stacked structure may include more than two dies that are interconnected via inter-chip bond wires 40. For example, one or more intervening dies may be positioned between first and second dies 24, 26. In such a configuration, second die 26 is coupled with first die 24 by way of the intervening dies.

Inter-chip bond wires 40 are susceptible to external EMI which can cause electrostatic discharge (ESD) failure in end-use applications. In accordance with an embodiment, an electrically conductive shield 42 directly overlies stacked structure 30 and inter-chip bond wires 40. Electrically conductive shield 42 may be formed of a metal layer (e.g., aluminum, copper, silver, carbon, and so forth) having a thickness that is sufficient to block the external EMI. Electrically conductive shield 42 has a first end 44 physically coupled to spacer element 28 and a second end 46 physically coupled to lead frame 22. The term "physically coupled" refers to a direct connection without an intervening component, other than the fastening material used to physically couple conductive shield 42 to each of spacer element 28 and lead frame 22. Electrically conductive shield 42 covering inter-chip bond wires 40 can thereby provide shielding for the inter-chip bond wires 40 between first and second dies 24, 26 from the external EMI.

In this example, second end 46 of shield 42 is coupled to lead frame 22 adjacent to a first portion (e.g., one side wall 48) of an outer perimeter of first die 24 and shield 42 is a cantilevered structure such that electrically conductive shield 42 is not adjacent to the remainder (e.g., the other three sides) of the outer perimeter of first die 24. As such, additional bond wires 50 may be interconnected between additional bond pads 52 (see FIG. 3) on first active surface 32 of first die 24 and bond sites 54 on lead frame 22. Thus, bond wires 50 may be referred to herein as off-chip bond wires 50. Bond sites 54 may be displaced away from stacked structure 30 and bond sites 54 (and thus off-chip bond wires 50) may electrically interconnect with additional components 56 on lead frame 22. These additional components 56 may include capacitors, resistors, or any other suitable passive and/or active components.

In the illustrated example, electrically conductive shield 42 overlies stacked structure 30 and inter-chip bond wires 40, but does not overlie bond sites 54 and additional components 56. Thus, electrically conductive shielding may only be positioned at locations with the greatest potential for exposure to external EMI. In other embodiments, electrically conductive shield 42 may extend beyond stacked structure 30 to provide shielding at other sites that have significant potential for exposure to external EMI. In still other embodiments, multiple electrically conductive shields 42 may be utilized to suitably overlie other semiconductor die stacks. As such, shield 42 may be made as small as possible to provide EMI shielding where needed, while concurrently achieving weight, size, and cost savings as compared to configurations that include a grounded metal enclosure or lid covering the entire electronic device package.

The internal components of electronic device package 20 may be encapsulated in an molding compound 58, such as with an epoxy material, thermoset, or thermoplastic resin to provide protection from dust, humidity, and other environmental factors. The presence of spacer element 28 may serve to generally uniformly distribute the stress from molding compound 58 imposed upon shield 42 and on stacked structure 30. Note that molding compound 58 is shown in FIG. 1 with one or more leads 60 extending from molding compound 58. Molding compound 58 is represented by dashed lines in FIG. 2 so that the internal components of electronic device package 20 can be seen.

Figure 3:
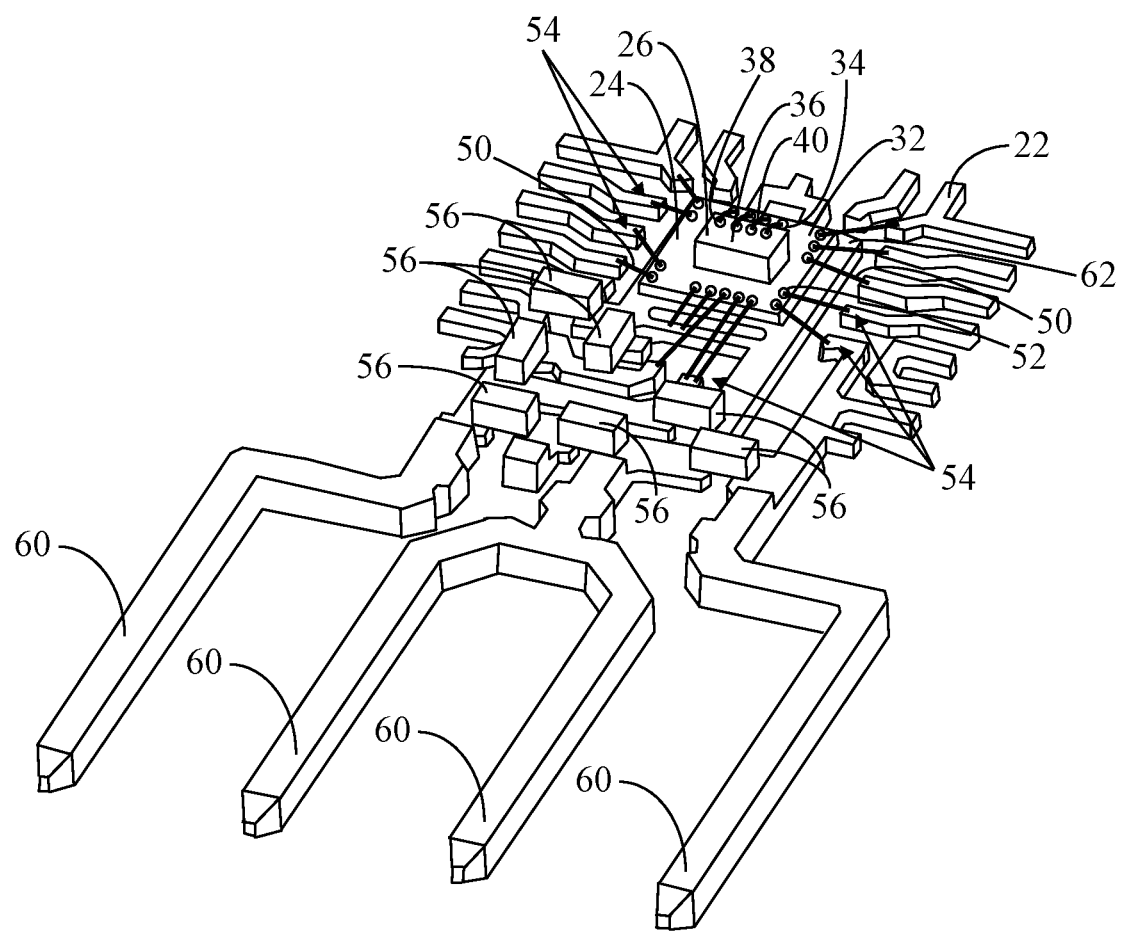
FIG. 3 shows a perspective view of the components of the electronic device package during an initial stage of fabrication.

FIG. 3 shows a perspective view of the components of an electronic device package (e.g., package 20 of FIGS. 1-2) during an initial stage of fabrication. In this example, first die 24 has been coupled to a die pad 62 of the substrate, e.g., lead frame 22, and second die 26 has been coupled to first active surface 32 of first die 24. First and second dies 24, 26 may be suitably attached by, for example, a standard stacked die attach pick and place process. Inter-chip bond wires 40 are connected between the one or more first bond pads 34 on first active surface 32 of first die 24 and the one or more second bond pads 38 on second active surface 36 of second die 26. Additionally, components 56 are coupled to lead frame 22 and off-chip bond wires 50 are connected between additional bond pads 52 and bond sites 54. Bond wires 40, 50 may be suitably formed using, for example, a wire bonding technique.

Figure 4:
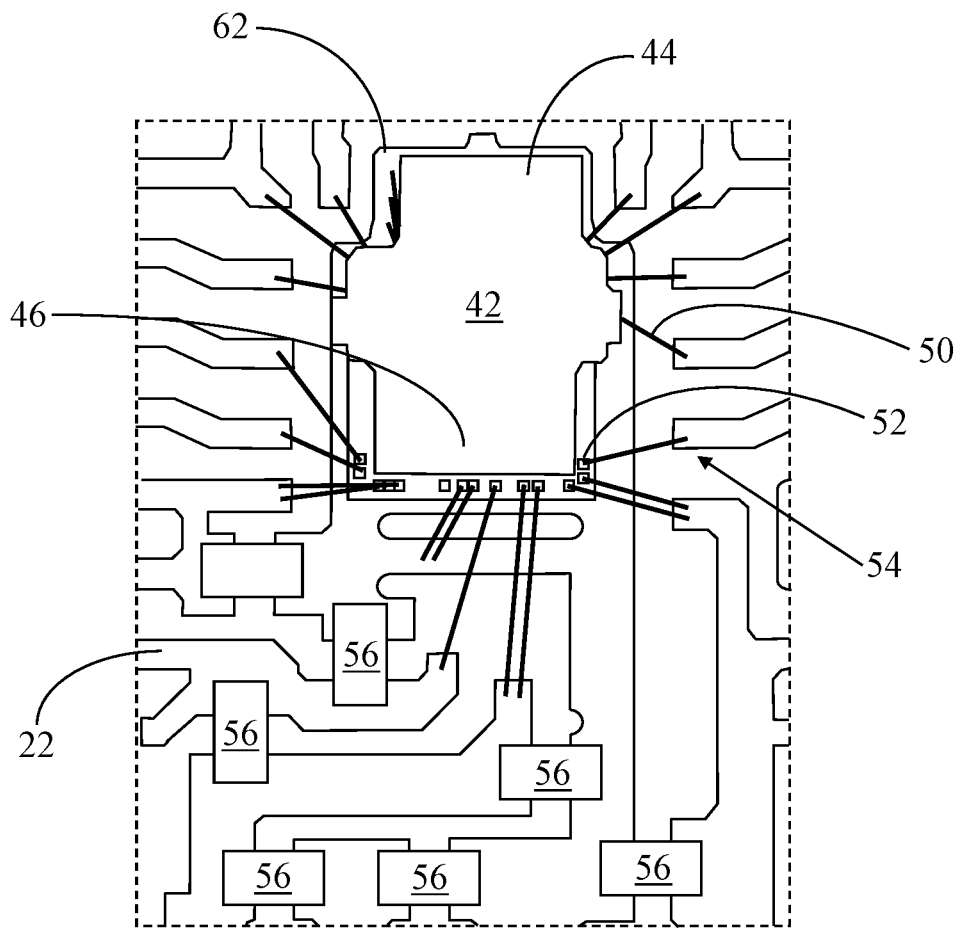
FIG. 4 shows an enlarged partial top view of an example of the electronic device package at a subsequent stage of fabrication.
Figure 5:
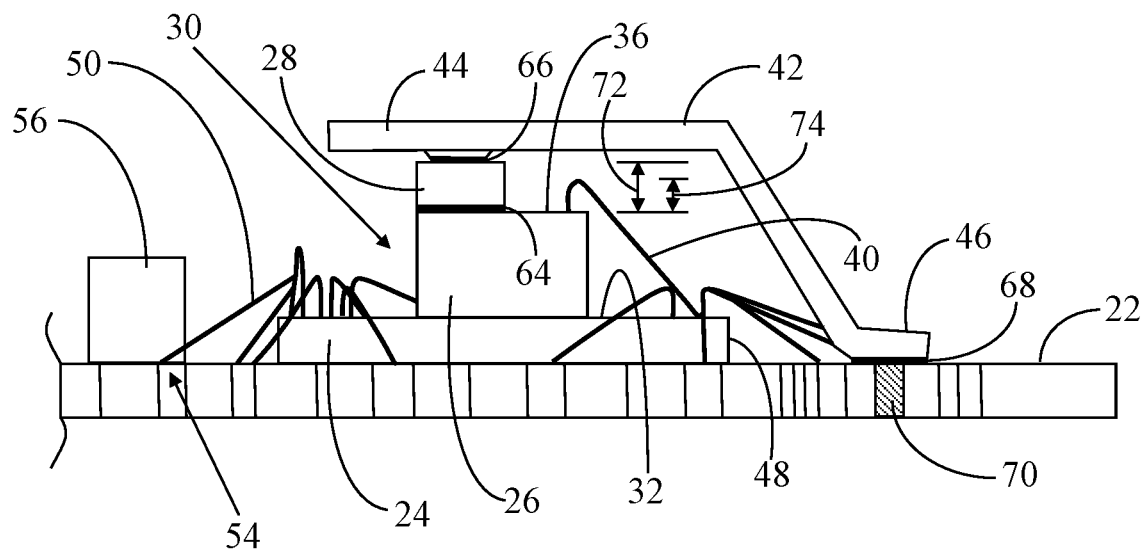
FIG. 5 shows a partial side view of an example of the electronic device package at the subsequent stage of fabrication shown in FIG. 4.

Referring now to FIGS. 4-5, FIG. 4 shows an enlarged partial top view of an example of the electronic device package (e.g., package 20 of FIGS. 1-2) at a subsequent stage of fabrication and FIG. 5 shows a partial side view of an example of the electronic device package (e.g., package 20 of FIGS. 1-2) at the subsequent stage of fabrication shown in FIG. 4. In the illustrated subsequent stage of fabrication, spacer element 28 is physically coupled to active surface 36 of second die 26 such that stacked structure 30 is formed that includes first die 24, second die 26, and spacer element 28. Spacer element 28 may be a "dummy die" in that it does not include electrically functioning features or circuits and is not electrically coupled to first and second dies 24, 26. In some embodiments, dummy die 28 may be formed of bare silicon and is electrically insulated from first and second dies 24, 26. By way of example, spacer element 28 may be attached to active surface 36 of second die 26 by a chip-on-chip or stacked die attach pick and place process using an electrically nonconductive epoxy or die attach film as a fastener 64.

Electrically conductive shield 42 may be provided by either a lead frame (singulation process required) or as a singulated piece part in a tape and reel configuration. First end 44 of electrically conductive shield 42 is physically coupled to spacer element 28. In some embodiments, first end 44 of shield 42 is physically coupled to spacer element 28 using an electrically nonconductive fastener 66, such as a nonconductive epoxy, silicone adhesive, a nonconductive die attach film, and so forth. Additionally, second end 46 of shield 42 may be physically coupled to the substrate, e.g., die pad 62 of lead frame 22, utilizing an electrically conductive fastener 68, such as a conductive epoxy, silicone, conductive die attach film, and so forth. Thus, die pad 62 of lead frame 22 may serve as a path to ground for electrically conductive shield 42. In some embodiments, die pad 62 may be suitably sized to extend beneath inter-chip bondwires 40 such that inter-chip bondwires 40 are interposed between electrically conductive shield 42 and die pad 62. Thus, electrically conductive shield 42 and die pad 62 together may form a "cage" for EMI protection.

In an alternative embodiment, the substrate may be an electrically nonconductive substrate, or may otherwise not be electrically coupled to ground. In such a configuration, second end 46 of shield 42 may be electrically attached to an electrically conductive terminal 70 extending through the substrate, as shown by way of example in FIG. 5. The electrically conductive fastening materials generally include, but are not limited to epoxies, silicones, and/or die attach film filled with silver, copper, carbon, or other conductive particulates. Conversely, the electrically nonconductive fastening materials generally include, but are not limited to epoxies, silicones, and/or die attach film in which conductive particulates are largely absent. Thereafter, nonconductive fasteners 64, 66, and conductive fastener 68 may be cured to secure spacer element 28 and shield 42.

Spacer element 28 has a defined thickness that allows sufficient clearance between the inter-chip bond wires 40 and electrically conductive shield 42 to prevent electrical shorting of inter-chip bond wires 40 and shield 42. As such, spacer element 28 is characterized by a first height 72 above second surface 36 of second die 26. The one or more inter-chip bond wires 40 extend to a second height 74 above second surface 36 of second die 26. Second height 74 is less than first height 72 so that inter-chip bond wires 40 cannot come into contact with shield 42. Thereafter, the configuration shown in FIGS. 4-5 may be encapsulated using molding compound 58 (FIG. 1) to yield the completed electronic device package 20 (FIG. 1).

Figure 6:
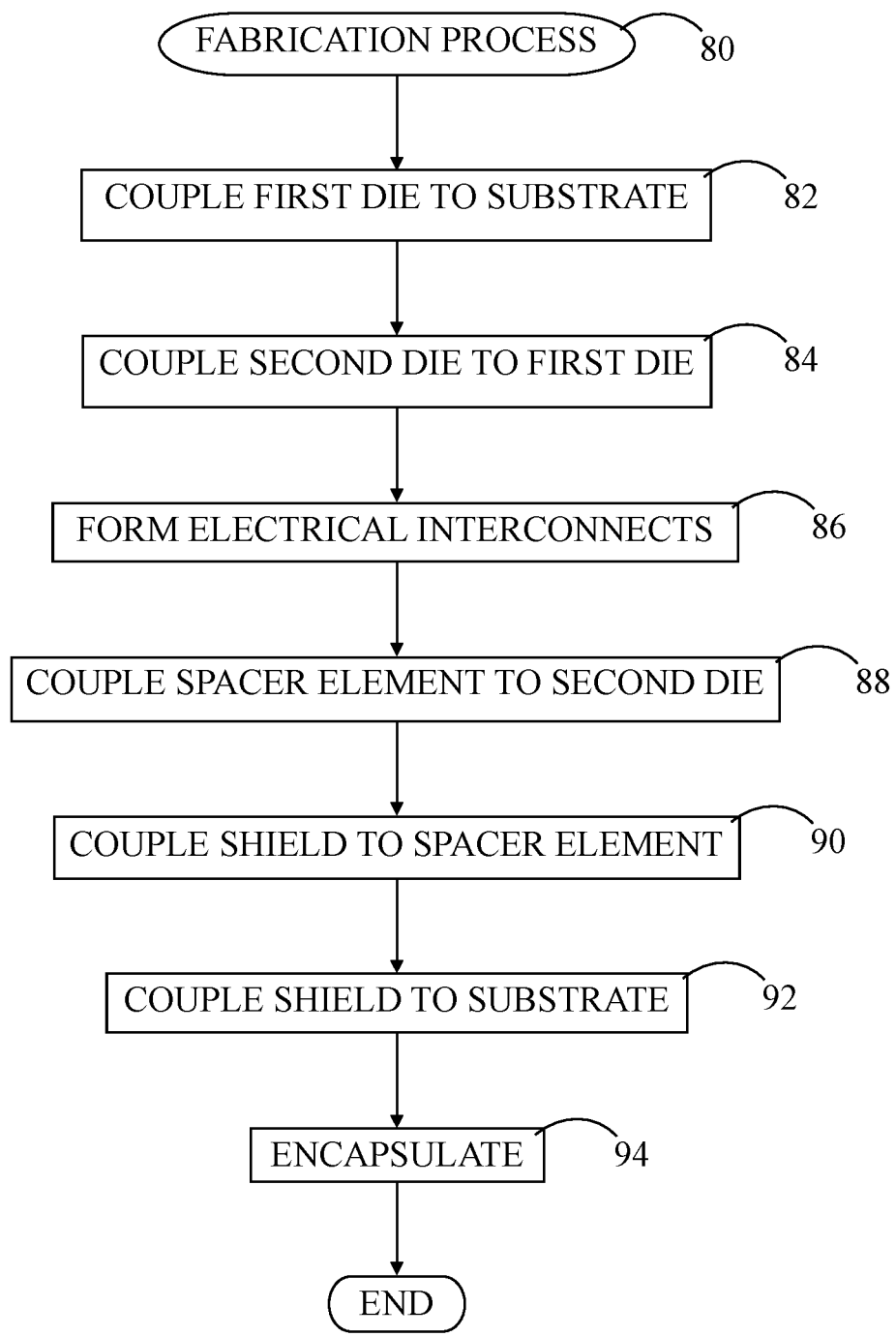
FIG. 6 shows a flowchart representation of a method for fabricating an electronic device package that includes an electromagnetic interference (EMI) shield integrally formed therein in accordance with another embodiment.

FIG. 6 shows a flowchart representation of a process 80 for fabricating an electronic device package that includes an electromagnetic interference (EMI) shield integrally formed therein in accordance with another embodiment. Fabrication process 80 may be performed to produce an electronic device package that includes a spacer element and an electrically conductive shield to provide shielding from external EMI for inter-chip bond wires of a stacked structure of dies. The following methodology will be described in connection with fabrication of a single electronic device package. However, it should be understood that fabrication process 80 may be expanded to concurrently fabricate multiple device packages.

At a block 82, a first die is coupled to a substrate (e.g., first die 24 is coupled to lead frame 22, FIG. 3). Additional components may also be coupled to the substrate (e.g., additional components 56 are coupled to lead frame 22, FIG. 3). At a block 84, a second die is coupled with the first die (e.g., second die 26 is coupled to first active surface 32 of first die 24). Additional blocks (not shown) may be included to attach intervening dies between the first and second dies to form a stacked structure that includes more than two functional semiconductor dies. At a block 86, electrically interconnects are formed. These electrical interconnects can include inter-chip bond wires and/or off-chip bond wires (e.g., inter-chip bond wires 40 may be formed to establish electrical connection between first and second dies 24, 26 and off-chip bond wires 50 may be formed to establish electrical connections between first die 24 and/or second die 26 to lead frame 22 and/or to components 56 mounted to lead frame 22).

At a block 88, a spacer element (as a nonfunctional dummy die) is coupled to the topmost functional die to yield a stacked structure (e.g., spacer element 28 is coupled to second active surface 36 of second die 26 using electrically nonconductive fastener 64 to yield stacked structure 30, FIG. 6). At a block 90, an electrically conductive shield is physically coupled to the spacer element (e.g., first end 44 of shield 42 is attached to spacer element 28 using electrically nonconductive fastener 66, FIG. 5). At a block 92, the electrically conductive shield is physically coupled to the substrate (e.g., second end 46 of shield 42 is attached to die pad 62 of lead frame 22 proximate side wall 48 of first die 24 using electrically conductive fastener 68). Following curing of the attachment adhesives (e.g., fasteners 64, 66, 68), the structure may be encapsulated with a molding compound to yield the electronic device package (e.g., encapsulation with molding compound 58 to yield electronic device package 20, FIG. 1). Thereafter, method fabrication method 80 may end.

It should be understood that certain ones of the process blocks depicted in FIG. 6 may be performed in parallel with each other or with performing other processes. In addition, the particular ordering of the process blocks depicted in FIG. 6 may be modified while achieving substantially the same result. For example, blocks 90 and 92 may be performed concurrently. Additionally or alternatively, block 88 may be performed prior to block 86. Accordingly, such modifications are intended to be included within the scope of the inventive subject matter.

Embodiments described herein entail an electronic device package having an electromagnetic interference (EMI) shield integrally formed within the electronic device package and a method of fabricating the electronic device package. More particularly, the electronic device package includes a stacked structure of dies with the bottommost die being coupled to a substrate. Electrical interconnects, e.g., bond wires, may be connected between the dies of the stacked structure. A spacer element is attached to the topmost die of the stacked structure and an electrically conductive shield overlies the stacked structure of dies. One end of the shield is attached to the spacer element and the opposing end of the shield is attached to the substrate. The shield can provide EMI shielding for at least the electrical interconnects between the dies of the stacked structure. Additionally, the spacer element has a defined thickness that allows sufficient clearance between the bond wires and the shield to prevent electrical shorting of the bond wires and the EMI shield. Still further, the electronic device package may be over molded and the spacer element may serve to more uniformly distribute the stress from the mold compound imposed upon the stacked structure.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An electronic device package comprising:
   a substrate;
   a first die coupled to the substrate;
   a second die coupled with the first die;
   a spacer element coupled to the second die to form a stacked structure that includes the first die, the second die, and the spacer element; and
   an electrically conductive shield overlying the stacked structure, the electrically conductive shield having a first end physically coupled to the spacer element and a second end physically coupled to the substrate; and
   a molding compound encapsulating the substrate, the stacked structure, and the electrically conductive shield;
   wherein the device package further comprises one or both of: an electrically nonconductive fastener coupling the first end of the electrically conductive shield to the spacer element; and an electrically conductive fastener coupling the second end of the electrically conductive shield to the substrate.

2. The electronic device package of claim 1 wherein:
   the first die has a first active surface and a first bond pad formed on the first active surface;
   the second die has a second bond pad has a second active surface and a second bond pad formed on the second active surface; and
   the electronic device package further comprises a bond wire electrically interconnecting the first and second bond pads, wherein the electrically conductive shield additionally overlies the bond wire.

3. The electronic device package of claim 2 wherein:
   the spacer element is characterized by a first height above the second active surface of the second die; and
   the bond wire extends to a second height above the second active surface of the second die, the second height being less than the first height.

4. The electronic device package of claim 1 wherein the spacer element is electrically insulated from the first and second dies.

5. The electronic device package of claim 1 wherein the substrate comprises a lead frame, the first die is coupled to a die pad of the lead frame, and the second end of the electrically conductive shield is electrically coupled to the die pad.

6. The electronic device package of claim 5 further comprising a bond wire electrically interconnecting the first and second dies, wherein the electrically conductive shield overlies the bond wire and the die pad extends beneath the bond wire such that the bond wire is interposed between the electrically conductive shield and the die pad.

7. The electronic device package of claim 1 wherein the substrate includes a ground terminal, and the second end of the electrically conductive shield is electrically coupled to the ground terminal.

8. The electronic device package of claim 1 wherein the second end of the electrically conductive shield is adjacent to a first portion of an outer perimeter of the first die, and the electrically conductive shield is a cantilevered structure such that the electrically conductive shield is not adjacent to a remaining portion of the outer perimeter of the first die.

9. The electronic device package of claim 1 wherein the electrically conductive shield does not overlie a remainder of the substrate.

10. The electronic device package of claim 1 wherein:
    the first die has a bond pad; and
    the electronic device package further comprises a bond wire interconnected between the bond pad and a bond site on the substrate, wherein the bond site is displaced away from the stacked structure and the electrically conductive shield does not overlie the bond site.

11. A method of fabricating an electronic device package comprising:
    coupling a first die to the substrate;
    coupling a second die with the first die;
    coupling a spacer element to the second die to form a stacked structure that includes the first die, the second die, and the spacer element;
    physically coupling a first end of an electrically conductive shield to the spacer element;
    physically coupling a second end of the electrically conductive shield to the substrate such that the electrically conductive shield overlies the stacked structure; and
    encapsulating the substrate, the stacked structure, and the electrically conductive shield within a molding compound;
    wherein the method further comprises one or both of:
    using an electrically nonconductive material to couple the first end of the electrically conductive shield to the spacer element; and
    using an electrically conductive material to couple the second end of the electrically conductive shield to the substrate.

12. The method of claim 11 wherein the first die has a first active surface and a first bond pad formed on the first active surface, the second die has a second bond pad has a second active surface and a second bond pad formed on the second active surface and the method further comprises electrically interconnecting the first and second bond pads via a bond wire such that the electrically conductive shield additionally overlies the bond wire.

13. The method of claim 12 wherein the spacer element is characterized by a first height above the second active surface of the second die, and the bond wire extends to a second height above the second active surface of the second die following the electrically interconnecting the first and second bond pads, the second height being less than the first height.

14. An electronic device package comprising:
a substrate;
a first die coupled to the substrate, the first die having a first active surface and a first bond pad formed on the first active surface;
a second die coupled with the first die, the second die having a second active surface and a second bond pad formed on the second active surface;
a spacer element coupled to the second active surface of the second die to form a stacked structure that includes the first die, the second die, and the spacer element, the spacer element being characterized by a first height above the second active surface;
a bond wire electrically interconnecting the first and second bond pads, the second bond wire extending to a second height above the second active surface of the second die, the second height being less than the first height;
an electrically conductive shield overlying the stacked structure and the bond wire, the electrically conductive shield having a first end physically coupled to the spacer element and a second end physically coupled to the substrate;
a molding compound encapsulating the substrate, the stacked structure, the bond wire, and the electrically conductive shield; and
one or both of: an electrically nonconductive fastener coupling the first end of the electrically conductive shield to the spacer element; and an electrically nonconductive fastener coupling the second end of the electrically conductive shield to the substrate.

15. An electronic device package comprising:
a substrate;
a first die coupled to the substrate;
a second die coupled with the first die;
a spacer element coupled to the second die to form a stacked structure that includes the first die, the second die, and the spacer element; and
an electrically conductive shield overlying the stacked structure, the electrically conductive shield having a first end physically coupled to the spacer element with an electrically non-conductive fastener and a second end physically coupled to the substrate.

16. A method of fabricating an electronic device package comprising:
coupling a first die to the substrate;
coupling a second die with the first die;
coupling a spacer element to the second die to form a stacked structure that includes the first die, the second die, and the spacer element;
physically coupling a first end of an electrically conductive shield to the spacer element utilizing an electrically nonconductive material; and
physically coupling a second end of the electrically conductive shield to the substrate such that the electrically conductive shield overlies the stacked structure.

* * * * *